(12) United States Patent
Saito et al.

(10) Patent No.: US 7,994,496 B2
(45) Date of Patent: Aug. 9, 2011

(54) LIGHT EMITTING ELEMENT AND MANUFACTURING METHOD THEREOF, AND LIGHT EMITTING DEVICE USING THE LIGHT EMITTING ELEMENT

(75) Inventors: Keiko Saito, Atsugi (JP); Hisao Ikeda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 590 days.

(21) Appl. No.: 12/081,962

(22) Filed: Apr. 24, 2008

(65) Prior Publication Data

US 2008/0203385 A1 Aug. 28, 2008

Related U.S. Application Data

(62) Division of application No. 10/951,966, filed on Sep. 29, 2004, now Pat. No. 7,387,904.

(30) Foreign Application Priority Data

Oct. 3, 2003 (JP) ................................. 2003-345579

(51) Int. Cl.
*H01L 51/40* (2006.01)
(52) U.S. Cl. .......................................... 257/40; 257/79
(58) Field of Classification Search ............ 257/88–103, 257/40, E33.001
See application file for complete search history.

(56) References Cited

U.S. PATENT DOCUMENTS

| | | | |
|---|---|---|---|
| 5,404,075 A | 4/1995 | Fujikawa et al. | |
| 5,457,565 A | 10/1995 | Namiki et al. | |
| 5,853,905 A | 12/1998 | So et al. | |
| 5,886,365 A | 3/1999 | Kouchi et al. | |
| 5,925,980 A | 7/1999 | So et al. | |
| 5,989,737 A | 11/1999 | Xie et al. | |
| 5,994,836 A | 11/1999 | Boer et al. | |
| 6,013,384 A | 1/2000 | Kido et al. | |
| 6,130,001 A | 10/2000 | Shi et al. | |
| 6,140,763 A | 10/2000 | Hung et al. | |
| 6,172,459 B1 | 1/2001 | Hung et al. | |
| 6,316,874 B1 | 11/2001 | Arai et al. | |
| 6,323,515 B1 | 11/2001 | Yamazaki et al. | |
| 6,366,017 B1 | 4/2002 | Antoniadis et al. | |
| 6,373,186 B1 | 4/2002 | Arai et al. | |

(Continued)

FOREIGN PATENT DOCUMENTS

DE 10135513 2/2003

(Continued)

OTHER PUBLICATIONS

Office Action (Application No. 04022554.2) Dated Mar. 2, 2010.

(Continued)

*Primary Examiner* — Cuong Q Nguyen
(74) *Attorney, Agent, or Firm* — Eric J. Robinson; Robinson Intellectual Property Law Office, P.C.

(57) ABSTRACT

A light-emitting element has a layer including an organic material between a first electrode and a second electrode, and further has a layer including a metal oxide between the second electrode and the layer including the organic material, where these electrodes and layers are laminated so that the second electrode is formed later than the first electrode. The light-emitting element is suppressed damage caused to a layer including an organic material during deposition by sputtering and a phenomenon such as short circuit between electrodes.

25 Claims, 16 Drawing Sheets

U.S. PATENT DOCUMENTS

| | | |
|---|---|---|
| 6,380,687 B1 | 4/2002 | Yamazaki |
| 6,423,429 B2 | 7/2002 | Kido et al. |
| 6,483,236 B1 | 11/2002 | Hung |
| 6,486,601 B1 | 11/2002 | Sakai et al. |
| 6,489,638 B2 | 12/2002 | Seo et al. |
| 6,518,700 B1 | 2/2003 | Friend et al. |
| 6,521,359 B1 | 2/2003 | Noguchi et al. |
| 6,525,466 B1 | 2/2003 | Jabbour et al. |
| 6,552,496 B2 | 4/2003 | Yamazaki |
| 6,579,629 B1 | 6/2003 | Raychaudhuri et al. |
| 6,589,673 B1 | 7/2003 | Kido et al. |
| 6,593,691 B2 | 7/2003 | Nishi et al. |
| 6,608,449 B2 | 8/2003 | Fukunaga |
| 6,611,108 B2 | 8/2003 | Kimura |
| 6,642,544 B1 | 11/2003 | Hamada et al. |
| 6,670,637 B2 | 12/2003 | Yamazaki et al. |
| 6,674,136 B1 | 1/2004 | Ohtani et al. |
| 6,677,613 B1 | 1/2004 | Yamazaki et al. |
| 6,689,492 B1 | 2/2004 | Yamazaki et al. |
| 6,690,033 B2 | 2/2004 | Yamazaki et al. |
| 6,692,845 B2 | 2/2004 | Maruyama et al. |
| 6,730,966 B2 | 5/2004 | Koyama |
| 6,738,034 B2 | 5/2004 | Kaneko et al. |
| 6,774,573 B2 | 8/2004 | Yamazaki |
| 6,794,278 B2 | 9/2004 | Kido et al. |
| 6,806,640 B2 | 10/2004 | Okada et al. |
| 6,830,494 B1 | 12/2004 | Yamazaki et al. |
| 6,831,408 B2 | 12/2004 | Hirano et al. |
| 6,841,932 B2 | 1/2005 | Aziz et al. |
| 6,869,635 B2 | 3/2005 | Kobayashi |
| 6,905,788 B2 | 6/2005 | Tyan et al. |
| 6,942,534 B2 | 9/2005 | Shibasaki et al. |
| 6,946,319 B2 | 9/2005 | Stegamat et al. |
| 6,956,240 B2 | 10/2005 | Yamazaki et al. |
| 6,982,179 B2 | 1/2006 | Kwong et al. |
| 7,074,500 B2 | 7/2006 | Pfeiffer et al. |
| 7,141,817 B2 | 11/2006 | Nishi et al. |
| 7,158,161 B2 * | 1/2007 | Gyoutoku et al. ............ 347/130 |
| 7,256,422 B2 | 8/2007 | Yamazaki |
| 7,274,141 B2 | 9/2007 | Leo et al. |
| 7,291,973 B2 | 11/2007 | Ishihara et al. |
| 2001/0053559 A1 | 12/2001 | Nagao et al. |
| 2002/0030443 A1 | 3/2002 | Konuma et al. |
| 2003/0080338 A1 | 5/2003 | Yamazaki et al. |
| 2003/0160260 A1 | 8/2003 | Hirai et al. |
| 2003/0189401 A1 | 10/2003 | Kido et al. |
| 2004/0161192 A1 | 8/2004 | Hamano et al. |
| 2005/0007016 A1 | 1/2005 | Mori et al. |
| 2005/0035708 A1 | 2/2005 | Yamazaki et al. |
| 2006/0046334 A1 | 3/2006 | Yamazaki et al. |
| 2007/0170843 A1 | 7/2007 | Kawamura et al. |
| 2007/0200125 A1 | 8/2007 | Ikeda et al. |
| 2009/0206726 A1 | 8/2009 | Yamazaki et al. |
| 2010/0096627 A1 | 4/2010 | Ikeda et al. |
| 2010/0207518 A1 | 8/2010 | Ikeda et al. |

FOREIGN PATENT DOCUMENTS

| | | |
|---|---|---|
| EP | 0 855 848 | 7/1998 |
| EP | 0 948 063 | 10/1999 |
| EP | 1 009 198 | 6/2000 |
| EP | 1022789 A | 7/2000 |
| EP | 1 065 723 | 1/2001 |
| EP | 1 089 361 | 4/2001 |
| EP | 1 093 167 | 4/2001 |
| EP | 1 160 891 | 12/2001 |
| EP | 1 179 862 | 2/2002 |
| EP | 1 261 042 | 11/2002 |
| EP | 1 351 558 | 10/2003 |
| EP | 1722602 A | 11/2006 |
| JP | 01-312873 | 12/1989 |
| JP | 02-139892 | 5/1990 |
| JP | 03-114197 | 5/1991 |
| JP | 03-190088 | 8/1991 |
| JP | 03-274695 | 12/1991 |
| JP | 04-357694 | 12/1992 |
| JP | 05-182766 | 7/1993 |
| JP | 06-163158 | 6/1994 |
| JP | 06-267658 | 9/1994 |
| JP | 06-290873 | 10/1994 |
| JP | 07-312289 | 11/1995 |
| JP | 09-063771 | 3/1997 |
| JP | 10-255985 | 9/1998 |
| JP | 2824411 | 9/1998 |
| JP | 10-270171 | 10/1998 |
| JP | 10-308284 | 11/1998 |
| JP | 2824411 | 11/1998 |
| JP | 11-251067 | 9/1999 |
| JP | 11-297474 | 10/1999 |
| JP | 11-307259 | 11/1999 |
| JP | 11-307264 | 11/1999 |
| JP | 2000-223276 | 8/2000 |
| JP | 2000-315580 | 11/2000 |
| JP | 2000-315581 | 11/2000 |
| JP | 2001-043980 | 2/2001 |
| JP | 2001-076868 | 3/2001 |
| JP | 2001-176673 | 6/2001 |
| JP | 2001-185354 | 7/2001 |
| JP | 2001-244079 | 9/2001 |
| JP | 2002-015873 | 1/2002 |
| JP | 2002-075658 | 3/2002 |
| JP | 2002-332567 | 11/2002 |
| JP | 2002-359086 | 12/2002 |
| JP | 2002-367784 | 12/2002 |
| JP | 2003-068472 A | 3/2003 |
| JP | 2003-229278 | 8/2003 |
| JP | 2003-249357 | 9/2003 |
| JP | 2003-272860 | 9/2003 |
| JP | 2004-134395 | 4/2004 |
| JP | 2004-514257 | 5/2004 |
| JP | 2004-349007 | 12/2004 |
| JP | 2005-026121 | 1/2005 |
| JP | 2005-032618 A | 2/2005 |
| JP | 2005-044799 | 2/2005 |
| JP | 2005-251639 A | 9/2005 |
| JP | 2005-259550 A | 9/2005 |
| KR | 2000-0052292 A | 8/2000 |
| WO | WO 00/01203 | 1/2000 |
| WO | WO 01/15244 | 3/2001 |
| WO | WO 02/41414 | 5/2002 |
| WO | WO-2005/031798 | 4/2005 |

OTHER PUBLICATIONS

Tokito, S. et al., *Metal Oxides as a Hole-Injecting Layer for an Organic Electroluminescent Device*, Journal of Applied Physics, 1996, vol. 29, pp. 2750-2753.

International Search Report dated Mar. 22, 2005 for Application No. PCT/JP2004/014412; PCT7385.

Written Opinion dated Mar. 22, 2005 for Application No. PCT/JP2004/014412; PCT7385.

International Search Report dated Apr. 12, 2005 for Application No. PCT/JP2004/019466; PCT7647.

Written Opinion dated Apr. 12, 2005 for Application No. PCT/JP2004/019466; PCT7647.

Nakada, T., et al., *Multi Photon Emission Organic EL Devices Using Charge-Transfer Complex as Charge Generation Layer*, The 63$^{rd}$ Autumn Meeting, 2002, vol. 27a-ZL-12, p. 1165.

European Search Report dated Mar. 17, 2006 for Application No. 04022554.2.

Korean Office Action (Application No. 2004-0076552) Dated Feb. 18, 2011.

Korean Office Action (Application No. 2009-0081820) Dated Feb. 18, 2011.

Tokito, S. et al., Metal Oxides as a Hole-Injecting Layer for an Organic Electroluminescent Device, Journal of Physics D: Applied Physics, 1996, vol. 29, pp. 2750-2753.

Nakada, T., et al., Multi Photon Emission Organic EL Devices Using Charge-Transfer Complex as Charge Generation Layer, 63rd Applied Physics-Related Combined Seminar Proceedings, vol. 27a-ZL-12, p. 1165.

* cited by examiner

LIGHT EMITTING ELEMENT AND MANUFACTURING METHOD THEREOF, AND LIGHT EMITTING DEVICE USING THE LIGHT EMITTING ELEMENT

BACKGROUND OF THE INVENTION

1. Field of the Invention

The present invention relates to a light-emitting element that has a structure interposing a plurality of layers between a pair of electrodes, in particular, relates to a structure of the layers.

2. Description of the Related Art

A light-emitting device utilizing a light emission from an electroluminescent element (a light-emitting element) has been attracting attention as a device, for example, for displaying or for lighting.

As the light-emitting element that is used for the light-emitting device, an element that has a structure interposing a plurality of layers, each including a material such as a luminescent or carrier transporting material, between a pair of electrodes is well known.

In the case of this light-emitting element, one of the electrodes functions as an anode while the other electrode functions as a cathode, a hole injected from the anode side and an electron injected from the cathode side are recombined to form a molecule in a excited state, and light is emitted when the molecule returns to the ground state. The emitted light is extracted outside through one or both of the pair of electrodes.

As for a manufacturing process of the light-emitting element above, it is commonly known to form one of the electrodes, form the plurality of layers thereon, and form the other electrode further thereon.

In the case of manufacturing the light-emitting element in this way, the layers are sometimes so damaged in the process of forming the electrode after forming the plurality of layers that favorable characteristics cannot be obtained. This phenomenon is frequently observed particularly in the case of using sputtering to form the electrode. This is believed to be because high-energy atoms damage the layers in the process of using sputtering to form the electrode.

Consequently, a light-emitting element comprising a structure that is less subjected to damage even in the case of using sputtering to form the electrode and a manufacturing method thereof have been developed.

For example, Patent Document 1 or Patent Document 2 shows that damage to an organic layer, which is caused during deposition by sputtering, can be suppressed by providing a layer including phthalocyanine. In addition, Patent Document 3 also reports that damage to an organic layer, which is caused during deposition by sputtering, can be suppressed by providing a layer including AgLi.

However, the method shown in Patent Document 1 or Patent Document 2 may have problems that, for example, a process is increased for providing the layer including phthalocyanine between an electron transporting layer and an electron injecting electrode and the luminous efficiency in a red light emission is decreased due to phthalocyanine that absorbs light in a long wavelength range easily. In addition, the method shown in Patent Document 3 may have problems that, for example, as the film thickness of AgLi becomes thicker, the transmissivity of light becomes lower to decrease the external extraction efficiency of emitted light.

[Patent Document 1] Japanese Patent Laid-Open No. 2002-75658

[Patent Document 2] Japanese Patent Laid-Open No. 2002-359086

[Patent Document 3] Japanese Patent Laid-Open No. 2003-249357

SUMMARY OF THE INVENTION

It is an object of the present invention to provide a light-emitting element formed to suppress damage, which is caused to a layer including an organic material during deposition by sputtering. In addition, it is an object of the present invention to provide a light-emitting element formed to suppress damage, which is caused to a layer including an organic material during deposition by sputtering, and also to suppress a phenomenon such as short circuit between electrodes.

A light-emitting element according to the present invention is provided with a layer including a metal oxide between a pair of electrodes in order to suppress damage to a layer including an organic material, which is likely to be caused during deposition by sputtering.

A light-emitting element according to the present invention has a layer including an organic material between a first electrode and a second electrode, and further has a layer including a metal oxide between the second electrode and the layer including the organic material, where these electrodes and layers are laminated so that the second electrode is formed later than the first electrode.

The layer including the organic material may be a single layer or a multilayer. Preferably, a material such as a highly carrier (electron or hole) transporting material and a highly carrier injecting material are combined to form the layer including the organic material so that a light-emitting region is formed in a portion that is away from the first electrode and the second electrode. Further, the layer including the organic material may include a metal element such as lithium or magnesium or another metal element in a portion thereof.

In addition, specific examples of the metal oxide include molybdenum oxide (MoOx), vanadium oxide (VOx), ruthenium oxide (RuOx), tungsten oxide (WOx), manganese oxide (MnOx), and the like and it is preferred that these are formed by evaporation.

In the case of the light-emitting element according to the present invention, as described above, which has the structure in which the layer including the metal oxide is provided between the second electrode and the layer including the organic material, the second electrode can be formed by sputtering.

Therefore, as the second electrode, it becomes easier to use a material that is easier to deposit by sputtering than evaporation, for example, indium tin oxide (ITO), indium tin oxide containing silicon (ITSO), or IZO (Indium Zinc Oxide) of indium oxide mixed with zinc oxide (ZnO) at 2 to 20%, and then, the material for forming the second electrode has a wide range of choice.

In addition, even in the case of a light-emitting element of a structure that has a film formed by sputtering between the second electrode and the layer including the metal oxide, damage to a layer including an organic material due to deposition by sputtering can be suppressed in the same way as described above. In this case, it is not always necessary to form the second electrode by sputtering. The advantage of the present invention can be obtained as long as a light-emitting element has a structure in which a layer including an organic material, a layer including a metal oxide, and a layer formed by sputtering are laminated in order.

According to the present invention, it is possible to obtain a light-emitting element where a defect due to deposition by sputtering is suppressed. In addition, it is possible to obtain a light-emitting element where a defect due to deposition by sputtering is suppressed and short circuit between electrodes is also suppressed.

DETAILED DESCRIPTION OF THE INVENTION

Embodiment Mode

Figure 1:
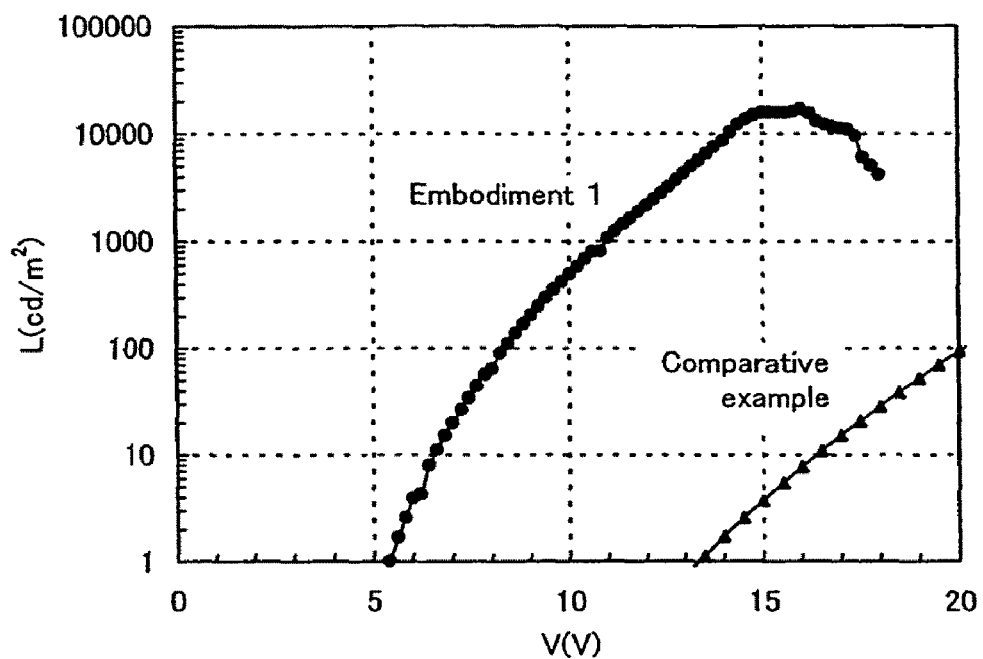
FIG. 1 is a diagram showing voltage-luminance characteristics of a light-emitting element according to the present invention and a light-emitting element according to a comparative example.

A light-emitting element according to the present invention has a layer including an organic material between a pair of electrodes. The layer including the organic material has a single layer or a plurality of layers. Preferably, a layer including a highly carrier injecting material and a layer including a highly carrier transporting material are combined to form the layer including the organic material so that a light-emitting region is formed away from the electrodes, that is, so that carriers are recombined in a portion that is away from the electrodes.

One mode of the light-emitting element according to the present invention will be described below with reference to FIGS. 2A to 2C.

In the present embodiment mode, a light-emitting element 210 is provided over a substrate 200 for supporting the light-emitting element 210, and has a first electrode 201, first to fifth layers 202 to 206 laminated on the first electrode 201 in order, and a second electrode 207 further provided thereon so that the first electrode 201 functions as a cathode and the second electrode 207 functions as an anode.

As the substrate 200, for example, glass or plastic can be used. Another material other than these may be used as long as the material functions as a support in a manufacturing process of a light-emitting element.

It is preferable that the first electrode 201 is formed to include a material that has a small work function (a work function of 3.8 eV or less) such as a metal, an alloy, an electrically conductive compound, or a mixture of these, which specifically include elements belonging to Group 1 or Group 2 of the periodic table of the elements, that is, an alkali metal such as lithium (Li) or cesium (Cs) and an alkali earth metal such as magnesium (Mg), calcium (Ca), or strontium (Sr), and an alloy including the element, for example, an aluminum alloy (Al:Li) or a silver alloy (Mg:Ag). However, by providing a layer that has a function of promoting electron injections in contact with the first electrode 201 between the first electrode 201 and the second electrode 207, various conductive materials such as Al, Ag, indium tin oxide (ITO), and ITO containing silicon (Si) can be used as the first electrode 201 regardless of magnitude of work function. In this regard, however, another materials other than the materials mentioned in the present embodiment mode may be used.

The first layer 202 is a layer including a highly electron injecting material, for example, a compound of an alkali metal or alkali earth metal such as lithium fluoride (LiF), cesium fluoride (CsF), or calcium fluoride (CaF$_2$). In addition, the first layer 202 may be a layer including a highly electron transporting material and either an alkali metal or an alkali earth metal, for example, a layer including Alq$_3$ and magnesium (Mg).

The second layer 203 is a layer including a highly electron transporting material, for example, a metal complex that has a quinoline moiety or a benzoquinoline moiety such as tris (8-quinolinolato)aluminum (abbreviation: Alq$_3$), tris(5-methyl-8-quinolinolato)aluminum (abbreviation: Almq$_3$), bis (10-hydroxybenzo[h]-quinolinato)beryllium (abbreviation: BeBq$_2$), or bis(2-methyl-8-quinolinolato)-4-phenylphenolato-aluminum (abbreviation: BAlq). In addition, a metal complex that has a ligand such as an oxazole or a thiazole, for example, bis[2-(2-hydroxyphenyl)-benzoxazolato]zinc (abbreviation: Zn(BOX)$_2$) or bis[2-(2-hydroxyphenyl)-benzothiazolato]zinc (abbreviation: Zn(BTZ)$_2$), can be used. Further, in addition to the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl] benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), and bathocuproin (abbreviation: BCP) can also be used. In this regard, however, another materials other than the materials mentioned in the present embodiment mode may be used.

The third layer 204 is a layer including a highly luminescent material. For example, a highly luminescent material such as N,N'-dimethyl quinacridone (abbreviation: DMQd) or 2H-chromen-2-one (abbreviation: coumarin) and a highly carrier transporting material such as tris(8-quinolinolato)aluminum (abbreviation: Alq$_3$) or 9,10-di(2-naphthyl)anthracene (abbreviation: DNA) are freely combined to form the third layer 204. However, since Alq₃ and DNA are also highly luminescent materials, these materials may be used singularly as the third layer 204.

The fourth layer 205 is a layer including a highly hole transporting material, for example, an aromatic amine compound (that is, a compound that has a benzene ring-nitrogen bond) such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4', 4"-tris (N,N-diphenyl-amino)-triphenylamine (abbreviation: TDATA), or 4,4', 4"-tris[N-(3-methylphenyl)-N-phenyl-amino]-triphenylamine (abbreviation: MTDATA). In this regard, however, another materials other than the materials mentioned in the present embodiment mode may be used.

The fifth layer 206 is a layer including a metal oxide such as molybdenum oxide (MoOx), vanadium oxide (VOx), ruthenium oxide (RuOx), tungsten oxide (WOx), or manganese oxide (MnOx). By providing the layer including the metal oxide in this way, it is possible to suppress damage to the layers respectively including organic compounds (the first to fourth layers in the present embodiment mode), which is caused in the case of using sputtering in the process of forming the second electrode 207. In the present embodiment mode, it is preferable that the layer including the metal oxide is formed by evaporation. In addition, it is preferable that the layer including the metal oxide has a film thickness of 10 nm or more. In order to suppress damage due to sputtering, it is effective to form the layer including the metal oxide to have the film thickness as mentioned above. As the layer including the metal oxide, another materials other than the materials mentioned in the present embodiment mode may be used.

For example, the fifth layer 206 may be a layer including a metal oxide and a highly hole transporting material. Materials such as α-NPD and TPD described above are cited as the highly hole transporting material. By including the highly transporting material in this manner, it becomes easier for the fifth layer 206 to generate holes. Additionally, by changing the thickness of the fifth layer 206 including the highly hole transporting material to adjust a distance between a layer including a highly light emitting material (the third layer 204 in this embodiment) and the second electrode 207, it becomes easier to extract light emission showing a preferable spectrum to the outside. This is because a increase of driving voltage that may be generated by making the thickness of the fifth layer 206 thicker can be reduced by including the highly hole transporting material.

Further, in the case of forming the layer including the metal oxide to have a film thickness of 100 nm or more, it is possible to suppress short circuit between the first electrode 201 and the second electrode 207, which is caused due to a factor such as a projection formed at a film surface of the first electrode 201 or the second electrode 207 or due to a foreign object mixed between these electrodes. Since the metal oxide has a high light-transmitting property, emitted light can be extracted sufficiently even when the film thickness becomes thicker.

It is preferable that the second electrode 207 is formed to include a material that has a large work function (a work function of 4.0 eV or more) such as a metal, an alloy, an electrically conductive compound, or a mixture of these. Specifically, materials such as gold (Au), platinum (Pt), nickel (Ni), tungsten (W), chromium (Cr), molybdenum (Mo), iron (Fe), cobalt (Co), copper (Cu), palladium (Pd), and a nitride of a metal (such as TiN) can be used in addition to indium tin oxide (ITO), indium tin oxide containing silicon, and IZO (Indium Zinc Oxide) of indium oxide mixed with zinc oxide (ZnO) at 2 to 20%. In this way, a conductive material that can be deposited by sputtering is used to form the second electrode 207. In this regard, however, another materials other than the materials mentioned in the present embodiment mode may be used.

In the light-emitting element according to the present invention, which has the structure described above, a current flows due to a potential difference generated between the first electrode 201 and the second electrode 207, a hole and an electron are recombined in the third layer 204 that is the layer including the highly luminescent material, and then, light is emitted. In other words, the light-emitting element has the structure so that a light-emitting region is formed in the third layer 204. However, it is not necessary that the third layer 204 wholly function as a light-emitting region, and for example, a light-emitting region may be formed only at a side of the second layer 203 or at a side of the fourth layer 205 in the third layer 204.

Emitted light is extracted outside through one or both of the first electrode 201 and the second electrode 207. Therefore, one or both of the first electrode 201 and the second electrode 207 are formed to include a light-transmitting material.

Figure 2A:
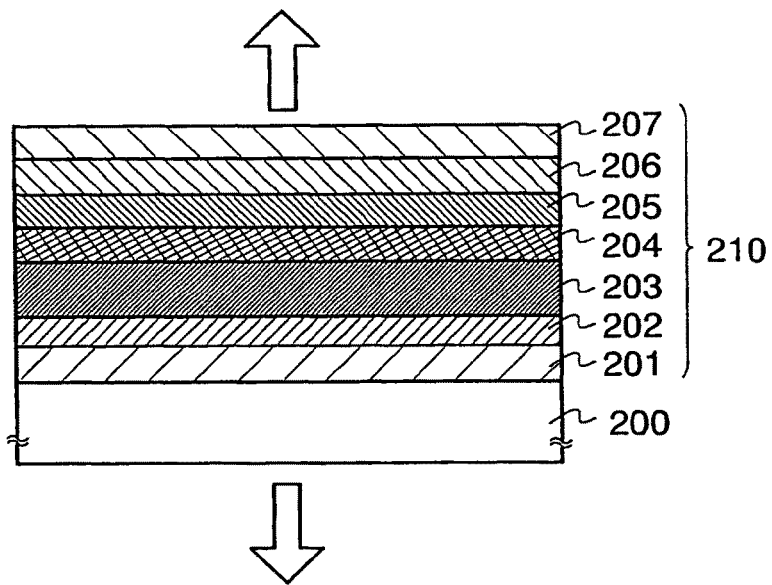
FIGS. 2A to 2C are diagrams illustrating a structure of layers of a light-emitting element according to the present invention.
Figure 2B:
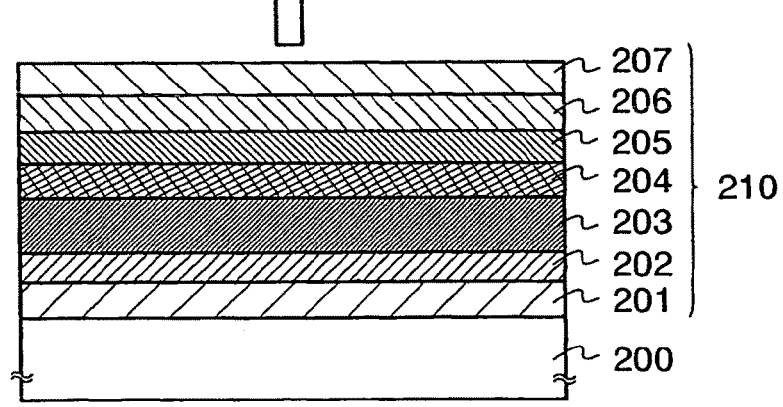
Figure 2C:
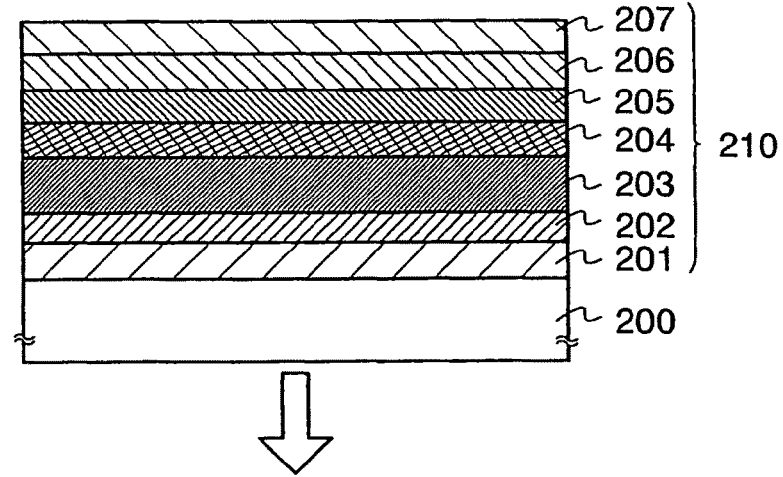

In the case where both the first electrode 201 and the second electrode 207 are formed to include a light-transmitting material, as shown in FIG. 2A, emitted light is extracted from both the substrate side and the side opposite to the substrate through the first electrode 201 and the second electrode 207. In the case where only the second electrode 207 is formed to include a light-transmitting material and in the case where the first electrode 201 and the second electrode 207 are formed to include a light-transmitting material and a reflective film is provided at the first electrode 201 side, as shown in FIG. 2B, emitted light is extracted from the side opposite to the substrate through the second electrode 207. In the case where only the first electrode 201 is formed to include a light-transmitting material and in the case where the first electrode 201 and the second electrode 207 are formed to include a light-transmitting material and a reflective film is provided at the second electrode 207 side, as shown in FIG. 2C, emitted light is extracted from the substrate side through the first electrode 201.

The layered structure provided between the first electrode 201 and the second electrode 207 is not limited to the structure described above. A structure other than the structure described above may be used as long as a region where a hole and an electron are recombined is provided in a portion that is away from the first electrode 201 and the second electrode 207 in the structure in order to suppress quenching caused by making a light-emitting region and a metal come close to each other and the structure has a layer including a metal oxide. In other words, the laminated structure is not particularly limited, and layers respectively including materials such as a highly electron transporting material, a highly hole transporting material, a highly electron injecting material, a highly hole injecting material, and a bipolar material (a highly electron and hole transporting material) may be freely combined with the layer including the metal oxide to make the laminated structure. Further, the recombination region of carriers may be controlled by providing a layer including, for example, an extremely thin silicon oxide film.

The light-emitting element described above is manufactured by forming the first electrode 201 over the substrate 200, laminating the first to fifth layers 202 to 206 thereon in order, and forming the second electrode 207 further thereon. Although a method of forming each layer is not particularly limited, it is preferable that any of evaporation, inkjet, and spin coating is used to form the layer.

Figure 3:
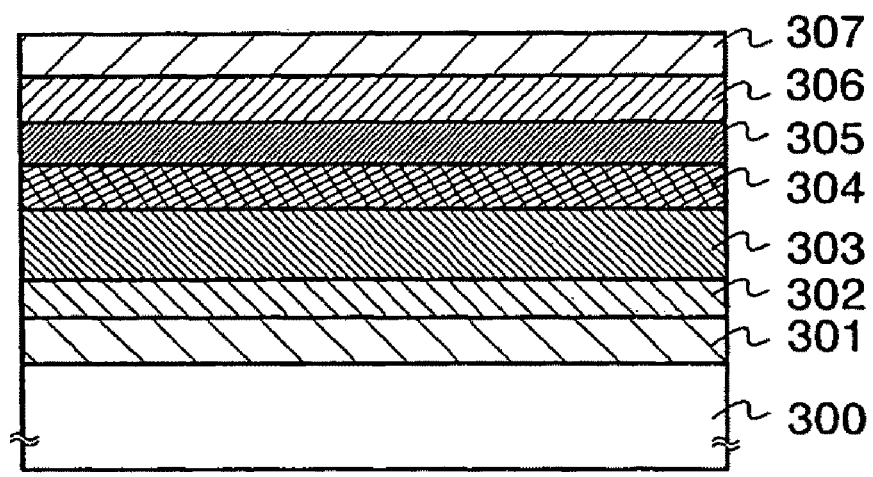
FIG. 3 is a diagram illustrating a structure of layers of a light-emitting element according to the present invention.

FIG. 3 shows a specific example of a light-emitting element according to the present invention, which has a different structure from the structure described above. A first electrode 301 is provided on a substrate 300, and first to fifth layers 302 to 306 are provided on the first electrode 301 by laminating in order. Further, a second electrode 307 is provided on the fifth layer 306.

Here, the first layer 302 is formed to include a highly hole injecting material, the second layer 303 is formed to include a highly hole transporting material, the third layer 304 is formed to include a highly carrier transporting material including a light emitter, and the fourth layer 305 is formed to include a highly electron transporting material. The fifth layer 306 is a layer including a metal oxide, and in addition, may include a highly electron injecting material such as an alkali metal or an alkali earth metal such as lithium or magnesium. Also in the case of the light-emitting element that has this structure, it is possible to suppress damage to a layer including an organic compound due to deposition by sputtering, as described above. When the light-emitting element has this structure, the first electrode 301 and the second electrode 307 function as an anode and a cathode, respectively. The light-emitting element shown in FIG. 3 is also one mode of the light-emitting element according to the present invention, and the structure of the light-emitting element according to the present invention is not limited to this.

In the thus described light-emitting element according to the present invention, damage to a layer including an organic material due to sputtering can be suppressed. In addition, short circuit between the electrodes can be suppressed by controlling the film thickness of the layer including the metal oxide. Furthermore, in a light-emitting device to which the light-emitting element according to the present invention is applied, a defect of the light-emitting element due to sputtering or short circuit between the electrodes is suppressed, and for example, in a display device, favorable display images can be obtained.

In the present embodiment mode, a case of forming an electrode by sputtering is described. However, for example, even in the case of a light-emitting element of a structure that has a film formed by sputtering between an electrode and a layer including a metal oxide, it is possible to obtain the advantage that damage to a layer including an organic material due to sputtering can be suppressed in the same way as in the present embodiment mode. In either case, as long as a light-emitting element has a structure in which a layer including an organic material, a layer including a metal oxide, and a layer formed by sputtering are laminated in order and the layer including the organic material is formed before the layer formed by sputtering is formed, the advantage of providing the layer including the metal oxide can be obtained.

Embodiment 1

A manufacturing method of a light-emitting element according to the present invention and characteristics of the light-emitting element will be described. The structure or manufacturing process of the light-emitting element according to the present invention is not limited to the present embodiment, and a film thickness or a material, for example, may be changed appropriately.

On a glass substrate, indium tin oxide (ITO) is deposited by sputtering to form a first electrode, where ITO in the deposition contains an amorphous component as its main component. Next, after etching ITO to be separated into elements, a heat treatment is performed at 200° C. for 1 hour. Further, after applying an acrylic that is a positive type photoresist, exposure and development are performed to form a partition layer. After that, a heat treatment is performed at 220° C. for 1 hour.

Next, after wet cleaning, the glass substrate with ITO deposited is processed at 150° C. for 30 minutes in an atmosphere of vacuum of $1\times10^{-6}$ Pa after UV-ozone treatment.

Next, 4,4'-bis(5-methylbenzoxazol-2-yl)stilbene (abbreviation: BzOs) and lithium (Li) are co-deposited to form a first layer on the first electrode. The weight ratio of BzOs to Li is controlled to be 1:0.02. In addition, the film thickness of the first layer is controlled to be 20 nm.

Next, $Alq_3$ is deposited to form a second layer on the first layer. The film thickness of the second layer is controlled to be 20 nm.

Next, $Alq_3$ and DMQD are co-deposited to form a third layer on the second layer. The weight ratio of $Alq_3$ to DMQD is controlled to be 1:0.01. In addition, the film thickness of the third layer is controlled to be 40 nm.

Next, α-NPD is deposited to form a fourth layer on the third layer. The film thickness of the fourth layer is controlled to be 40 nm.

In this way, the layers respectively including the organic materials (the first to fourth layers) are formed on the first electrode. The materials included in the respective layers are not limited to the materials mentioned in the present embodiment, and another materials may be used.

Next, molybdenum oxide that is a metal oxide is deposited to form a fifth layer on the fourth layer. The film thickness of the fifth layer is controlled to be 50 nm.

Next, ITO is deposited by sputtering to form a second electrode on the fifth layer. The substrate temperature during deposition (during plasma generation) is 40° C. to 50° C. The deposited ITO contains an amorphous component as its main component. The film thickness of the second electrode is controlled to be 110 nm.

Figure 4:
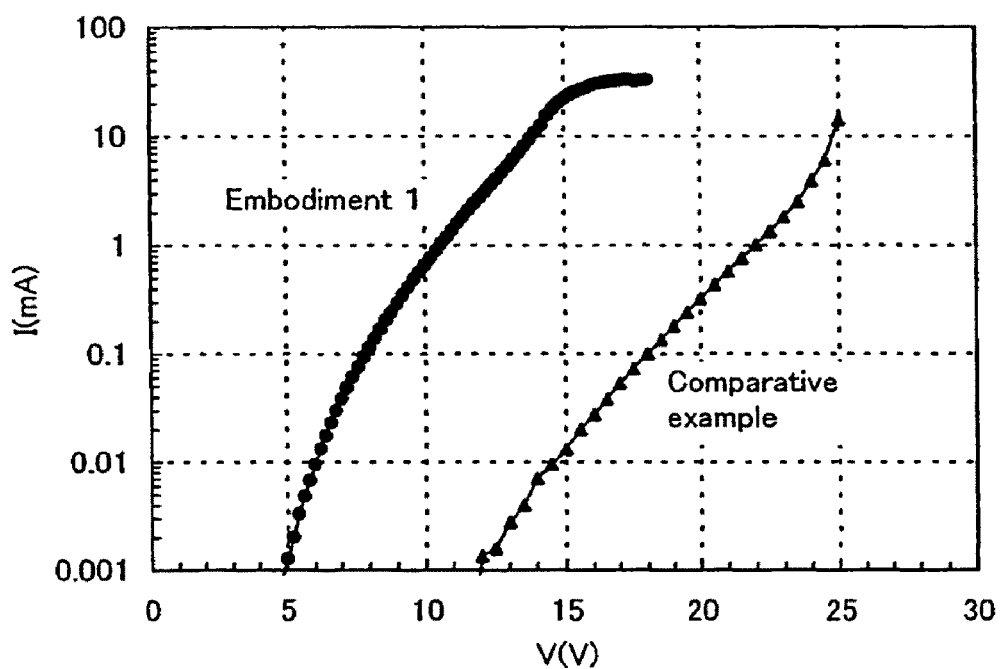
FIG. 4 is a diagram showing voltage-current characteristics of a light-emitting element according to the present invention and a light-emitting element according to a comparative example.
Figure 5:
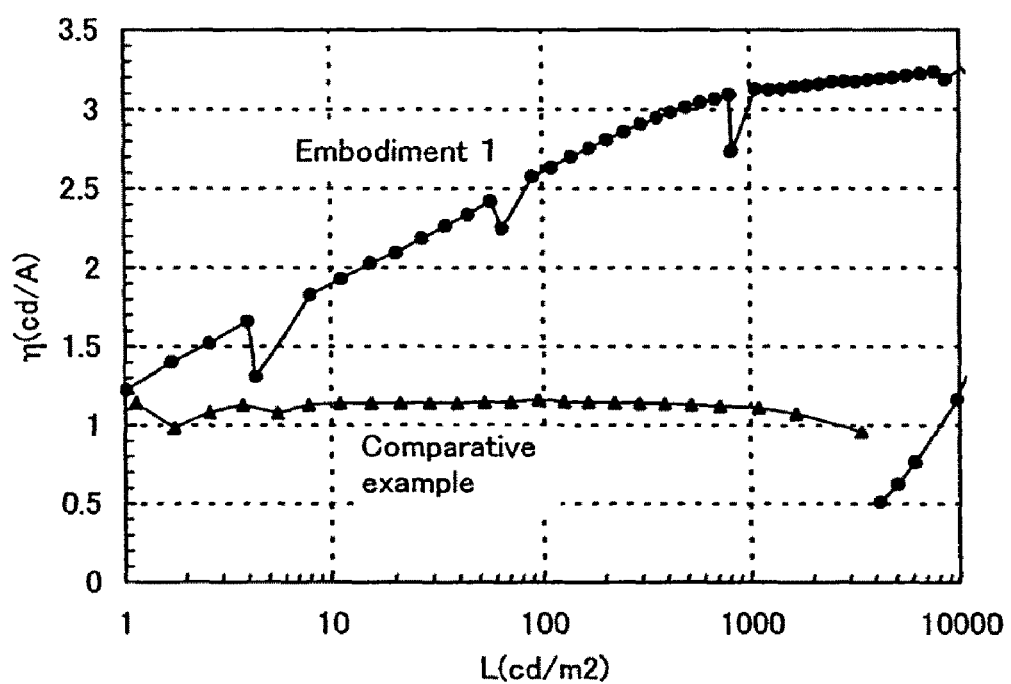
FIG. 5 is a diagram showing luminance-current efficiency characteristics of a light-emitting element according to the present invention.

Characteristics of the thus manufactured light-emitting element according to the present invention are shown by circle points in FIG. 1. FIG. 1 shows voltage-luminance characteristics, where a horizontal axis indicates a voltage (V) and a vertical axis indicates a luminance ($cd/m^2$). FIG. 1 indicates that a driving voltage (a voltage at which a light emission of 1 $cd/m^2$ or more is started is regarded as the driving voltage) is approximately 5.5 V. FIG. 4 shows voltage-current characteristics, where a horizontal axis indicates a voltage (V) and a vertical axis indicates a current (mA). FIG. 5 shows luminance ($cd/m^2$)-current efficiency (cd/A) characteristics, where a horizontal axis indicates a luminance and a vertical axis indicates a current efficiency.

Comparative Example 1

A comparative example with respect to the light-emitting element according to the present invention, shown in Embodiment 1, will be described.

A light-emitting element of the present comparative example has a structure in which a mixed layer including BzOs and Li (20 nm), a layer including $Alq_3$ (20 nm), a mixed layer including DMQD and $Alq_3$ (40 nm), a layer including A-NPD (40 nm), and a layer including CuPc (20 nm) are laminated in order on a first electrode including ITO, and a second electrode including ITO is further laminated thereon. In each case, ITO for the electrode is formed by sputtering in the same way as described above. In addition, the weight ratio of BzOs to Li is 1:0.02, and the weight ratio of $Alq_3$ to DMQD is 1:0.01.

Characteristics of the light-emitting element of the present comparative example are shown by trigonal points in FIG. 1.

FIG. 1 shows voltage-luminance characteristics, where a horizontal axis indicates a voltage (V) and a vertical axis indicates a luminance (cd/m$^2$). FIG. 1 indicates that a driving voltage (a voltage at which a light emission of 1 cd/m$^2$ or more is started is regarded as the driving voltage) is approximately 13 V. FIG. 4 shows voltage-current characteristics, where a horizontal axis indicates a voltage (V) and a vertical axis indicates a current (mA). FIG. 5 shows luminance (cd/m$^2$)-current efficiency (cd/A) characteristics, where a horizontal axis indicates a luminance and a vertical axis indicates a current efficiency. The characteristics of the light-emitting element are obtained from light emissions extracted from the second electrode side.

The characteristics of the light-emitting elements of Embodiment 1 and Comparative Example 1, as shown above, indicate the following. In the case of the light-emitting element of the comparative example using CuPc, the driving voltage of the light-emitting element is high (13 V) due to damage to a portion of the element (a layer including an organic material) in the process of depositing ITO by sputtering while the light-emitting element according to the present invention has no such a tendency. In other words, in the case of the light-emitting element according to the present invention, the defect of the light-emitting element due to sputtering can be more suppressed than in the case of the light-emitting element of the comparative example.

Embodiment 2

In the present embodiment, a light-emitting element that has the same structure as that shown in Embodiment 1 except that the fifth layer including molybdenum oxide has a different film thickness form that in Embodiment 1 will be described. A manufacturing method of the light-emitting element shown in the present embodiment is also the same as that in Embodiment 1. Therefore, descriptions of the manufacturing method are omitted.

As for the light-emitting element of the present embodiment, the fifth layer including molybdenum oxide has film thicknesses of 10 nm (Embodiment 2-1), 100 nm (Embodiment 2-2), and 200 nm (Embodiment 2-3).

Figure 6:
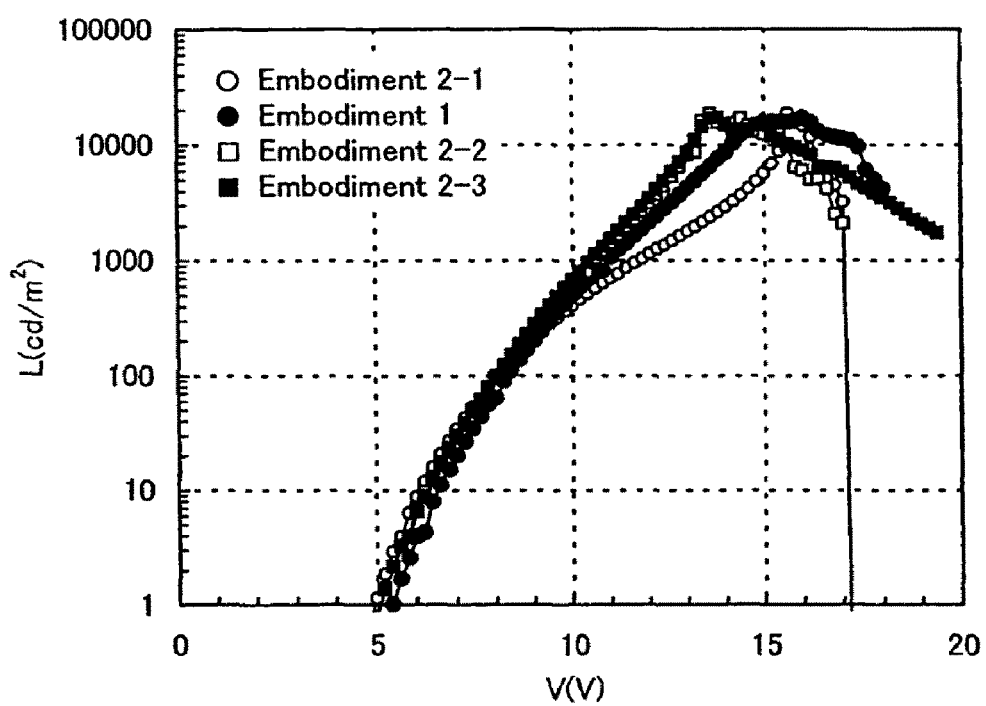
FIG. 6 is a diagram showing voltage-luminance characteristics of light-emitting elements according to the present invention.
Figure 7:
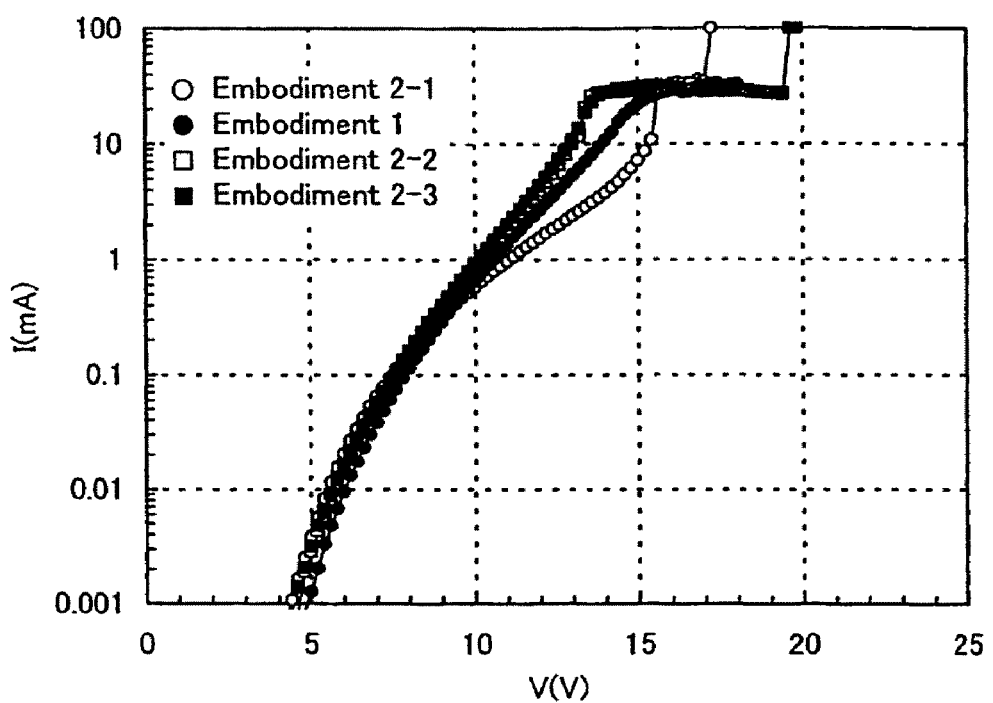
FIG. 7 is a diagram showing voltage-current characteristics of light-emitting elements according to the present invention.
Figure 8:
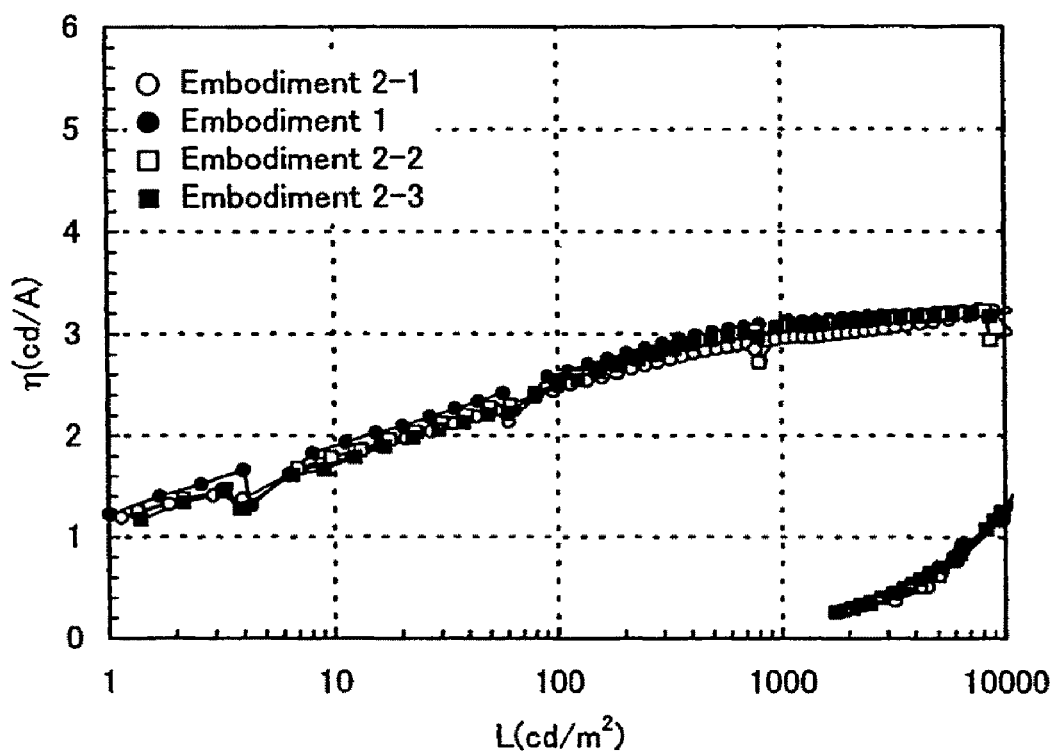
FIG. 8 is a diagram showing luminance-current efficiency characteristics of light-emitting elements according to the present invention.

Characteristics of the light-emitting elements of the present embodiment are shown in FIG. 6. FIG. 6 shows voltage-luminance characteristics, where a horizontal axis indicates a voltage (V) and a vertical axis indicates a luminance (cd/m$^2$). FIG. 6 indicates that a driving voltage (a voltage at which a light emission of 1 cd/m$^2$ or more is started is regarded as the driving voltage) is approximately 5 V in each case of light-emitting elements represented by Embodiments 2-1, 2-2, and 2-3. FIG. 7 shows voltage-current characteristics, where a horizontal axis indicates a voltage (V) and a vertical axis indicates a current (mA). FIG. 8 shows luminance (cd/m$^2$)-current efficiency (cd/A) characteristics, where a horizontal axis indicates a luminance and a vertical axis indicates a current efficiency. FIGS. 6 to 8 indicate that the characteristics of the light-emitting elements are comparable to each other regardless of the film thickness of the fifth layer when a lower voltage is applied, and that the light-emitting element that has the fifth layer with the thicker film thickness has a tendency to show a higher luminance when a higher voltage is applied. From here onwards, it is believed that damage due to sputtering can be more suppressed in the case of the light-emitting element that has the fifth layer with the thicker film thickness. The characteristics of the light-emitting elements are obtained from light emissions extracted from the second electrode sides.

As described above, as for the light-emitting element shown in the present embodiment, it is determined that favorable characteristics can be obtained even when the film thickness of the layer including the metal oxide is made thicker. Therefore, short circuit between the electrodes can be suppressed by thickening the film thickness of the layer including the metal oxide. Further, as for the light-emitting element shown in the present embodiment, it is determined that emitted light can be extracted outside efficiently even when the film thickness of the layer including the metal oxide is thicker.

Embodiment 3

In the present embodiment, a structure of a light-emitting device according to the present invention will be described.

Figure 9A:
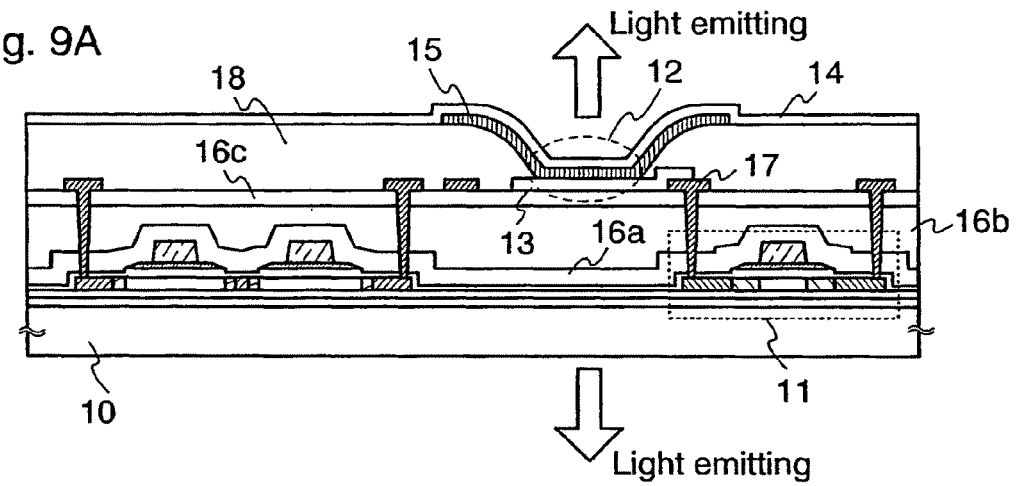
FIGS. 9A to 9C are diagrams illustrating cross-section structures of light-emitting devices according to the present invention.
Figure 9B:
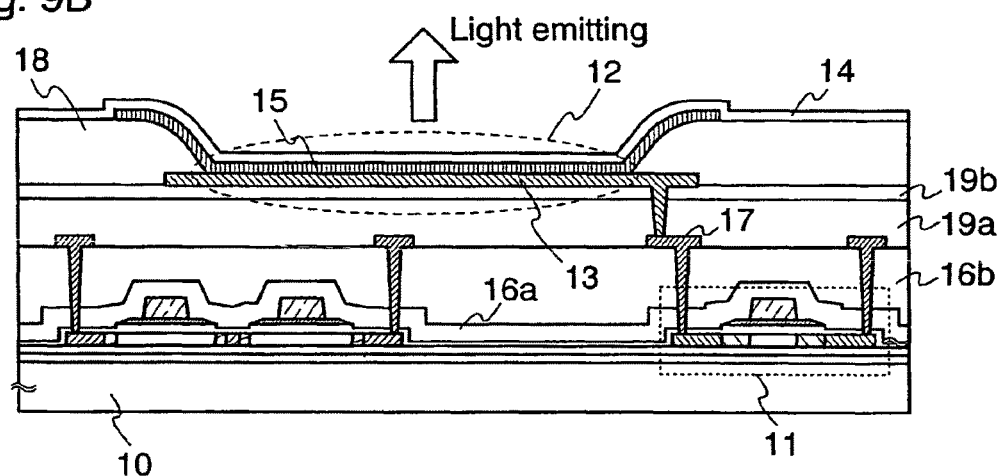
Figure 9C:
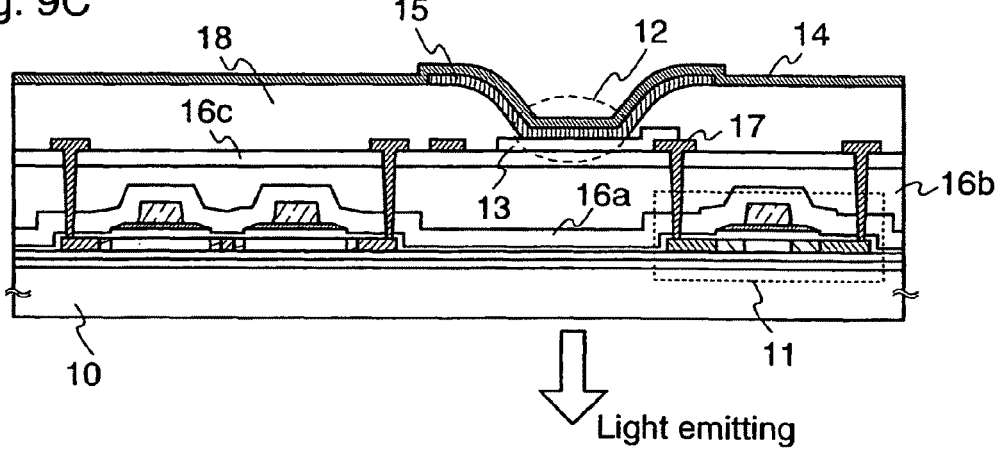

In each of FIGS. 9A to 9C, a portion surrounded by a dotted line is a transistor 11 provided for driving a light-emitting element 12. The light-emitting element 12 is formed to include a first electrode 13, a second electrode 14, and a light-emitting layer 15 interposed between these electrodes. The first electrode 13 and a drain of the transistor 11 are electrically connected to each other by a wiring 17 running through a first interlayer insulating film 16a to 16c. In addition, the light-emitting element 12 is separated by a partition layer 18 from another light-emitting element provided adjacently. A light-emitting device that has this structure according to the present invention is provided over substrate 10.

In the light-emitting device that has the structure described above, the light-emitting element 12 is a light-emitting element according to the present invention, and particularly, the light-emitting layer 15 includes the above-mentioned layer including the metal oxide as a component.

Figure 10A:
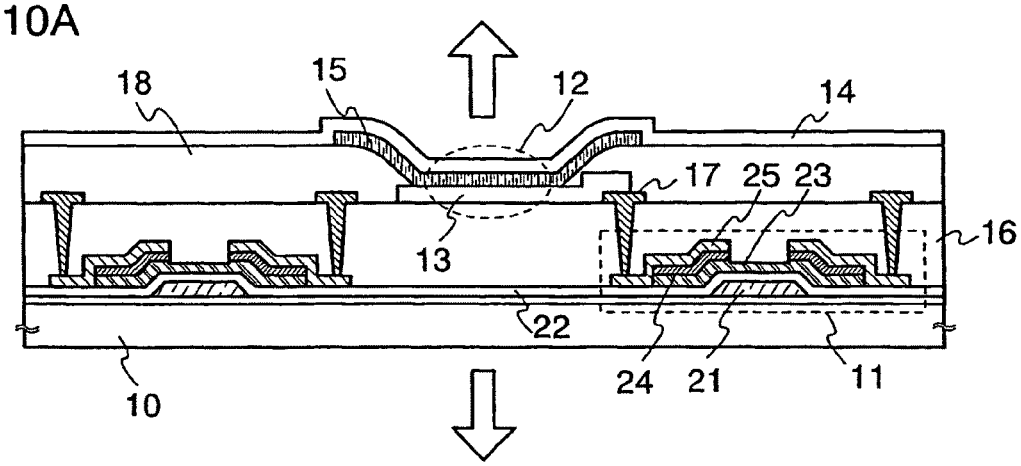
FIGS. 10A and 10B are diagrams illustrating cross-section structures of light-emitting devices according to the present invention.
Figure 10B:
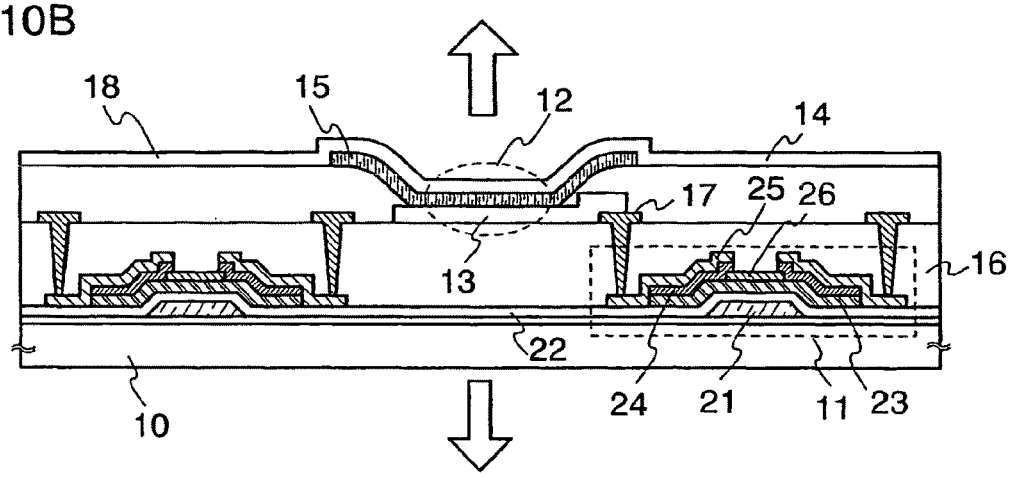

The transistor 11 is included in a top-gate type. However, the structure of the transistor 11 is not particularly limited. For example, an inversely staggered TFT as shown in FIG. 10A may be used. In the case of an inversely staggered TFT, a TFT where a protective film is formed on a semiconductor layer that forms a channel (a channel-protection TFT) may be used as shown in FIG. 10B, or a TFT where a portion of a semiconductor layer that forms a channel is concave (a channel-etch TFT) may be used. Here, reference numerals 21, 22, 23, 24, 25, and 26 denote a gate electrode, a gate insulating film, a semiconductor layer, an n-type semiconductor layer, an electrode, and a protective film, respectively.

In addition, a semiconductor layer forming the transistor 11 may be either crystalline or amorphous, or alternatively, may be semi-amorphous.

The following will describe a semi-amorphous semiconductor. The semi-amorphous semiconductor is a semiconductor that has an intermediate structure between amorphous and crystalline (such as single-crystal or polycrystalline) structures and has a third state that is stable in terms of free energy, which includes a crystalline region that has short range order and lattice strain. Further, a crystal grain from 0.5 to 20 nm is included in at least a region in a film of the semi-amorphous semiconductor. A raman spectrum of the semi-amorphous semiconductor has a shift to a lower wavenumber side than 520 cm$^{-1}$. In X-ray diffraction, diffraction peaks of (111) and (220) due to a Si crystal lattice are observed. Hydrogen or halogen is included at 1 atom % or more in the semi-amorphous semiconductor to terminate a dangling bond. Therefore, the semi-amorphous semiconductor is also referred to as a micro-crystalline semiconductor. A nitride gas is decomposed by glow discharge (plasma CVD) to form the semi-amorphous semiconductor. As the nitride gas, in addition to SiH$_4$, a gas such as Si$_2$H$_6$, SiH$_2$Cl$_2$, SiHCl$_3$, SiC$_4$, or SiF$_4$ can be used. This nitride gas may be diluted with H$_2$ or with H$_2$ and one kind or plural kinds of rare gas elements selected from He, Ar, Kr, and Ne, where the dilution ratio is in the range of 2:1 to 1000:1. The pressure during glow discharge is approximately in the range of 0.1 Pa to 133 Pa, and the power supply frequency is in the range of 1 MHz to 120 MHz, preferably 13 MHz to 60 MHz. The substrate heating temperature may be 300° C. or less, preferably 100 to 250° C. It is desirable to control an impurity of an atmospheric constituent such as oxygen, nitrogen, or carbon to have a concentration of $1 \times 10^{20}/cm^3$ or less as an impurity element in the film, in particular, the oxygen concentration is controlled to be $5 \times 10^{19}/cm^3$ or less, preferably $1 \times 10^{19}/cm^3$ or less. In addition, a TFT (thin film transistor) using the semi-amorphous semiconductor has a mobility of approximately 1 to 10 $m^2/Vsec$.

Further, specific examples of crystalline semiconductors for the semiconductor layer include single-crystal or polycrystalline silicon and silicon-germanium, which may be formed by laser crystallization or may be formed by crystallization with solid-phase growth using an element such as nickel.

In the case of using an amorphous material, for example, amorphous silicon to form the semiconductor layer, it is preferable that the light-emitting device has a circuit in which the transistor 11 and the other transistor (a transistor forming the circuit for driving the light-emitting element) are all n-channel transistors. Other than that case, the light-emitting device may have a circuit including one of an n-channel transistor and a p-channel transistor or may have a circuit including both an n-channel transistor and a p-channel transistor.

Further, the first interlayer insulating film 16a to 16c may be a multilayer as shown in FIGS. 9A and 9C, or may be a single layer. The first interlayer insulating film 16a includes an inorganic material such as silicon oxide or silicon nitride, and the first interlayer insulating film 16b includes a material with self-flatness such as acrylic, siloxane (a material that has a framework structure formed of a bond between silicon (Si) and oxygen (O) and includes at least hydrogen as a substituent), silicon oxide that can be used in coating for deposition. In addition, the first interlayer insulating film 16c has a silicon nitride film including argon (Ar). The materials included in the respective layers are not particularly limited, and therefore materials other than the materials mentioned here may be used. Further, a layer including a material other than these materials may be combined. In this way, both of an inorganic material and an organic material, or one of an inorganic material and an organic material may be used to form the first interlayer insulating film 16.

As for the partition layer 18, it is preferable that an edge portion has a shape varying continuously in curvature radius. In addition, a material such as acrylic, siloxane, resist, or silicon oxide is used to form the partition layer 18. One or both of an inorganic material and an organic material may be used to form the partition layer 18.

In each of FIGS. 9A and 9C, only the first interlayer insulating film 16 is provided between the transistor 11 and the light-emitting element 12. However, as shown in FIG. 9B, a second interlayer insulating film 19 (19a and 19b) may be provided in addition to the first interlayer insulating film 16 (16a and 16b). In the light-emitting device shown in FIG. 9B, the first electrode 13 is connected to the wiring 17 through the second interlayer insulating film 19.

The second interlayer insulating film 19 may be a multilayer or a single layer in the same way as the first interlayer insulating film 16. The second interlayer insulating film 19a includes a material with self-flatness such as acrylic, siloxane (a material that has a framework structure formed of a bond between silicon (Si) and oxygen (O) and includes at least hydrogen as a substituent), silicon oxide that can be used in coating for deposition. In addition, the second interlayer insulating film 19b has a silicon nitride film including argon (Ar). The materials included in the respective layers are not particularly limited, and therefore materials other than the materials mentioned here may be used. Further, a layer including a material other than these materials may be combined. In this way, both of an inorganic material and an organic material, or one of an inorganic material and an organic material may be used to form the second interlayer insulating film 19.

In the light-emitting element 12, in the case where both the first electrode 13 and the second electrode 14 are formed to include a light-transmitting material, emitted light can be extracted from both the first electrode 13 side and the second electrode 14 side as indicated by outline arrows of FIG. 9A. In the case where only the second electrode 14 is formed to include a light-transmitting material, emitted light can be extracted from only the second electrode 14 side as indicated by an outline arrow of FIG. 9B. In this case, it is preferable that the first electrode 13 includes a highly reflective material or that a film including a highly reflective material (a reflective film) is provided below the first electrode 13. In the case where only the first electrode 13 is formed to include a light-transmitting material, emitted light can be extracted from only the first electrode 13 side as indicated by an outline arrow of FIG. 9C. In this case, it is preferable that the second electrode 14 includes a highly reflective material or that a reflective film is provided above the second electrode 14.

In addition, in the case of the light-emitting element 12, the first electrode 13 may function as an anode while the second electrode 14 functions as a cathode, or alternatively, the first electrode 13 may function as a cathode while the second electrode 14 functions as an anode. However, the transistor 11 is a p-channel transistor in the former case, and the transistor 11 is an n-channel transistor in the latter case.

The light-emitting device of the present embodiment has a plurality of light-emitting elements (however, not shown in the figures). In the case where the emission wavelength of each light-emitting element is the same as the emission wavelength of the light-emitting element 12, the light-emitting device emits monochromatic light. In the case where the emission wavelength of each light-emitting element is different, the light-emitting device is able to emit light of a plurality of colors such as red (R), green (G), and a blue (B).

In the case of the above-mentioned light-emitting device, a light-emitting or non light-emitting state is controlled by a transistor electrically connected to each light-emitting element. By controlling a light-emitting or non light-emitting state of each light-emitting element, image display and the like are possible. In the light-emitting device, by applying the present invention, a defect due to a factor such as sputtering or short circuit between electrodes, which is likely to be caused in a manufacturing process of the light-emitting element, is suppressed, and favorable images can be displayed.

Embodiment 4

In the present embodiment, light-emitting devices according to the present invention will be described with reference to top views of FIGS. 11 and 12 and circuit diagrams of FIGS. 13A and 13B.

Figure 11:
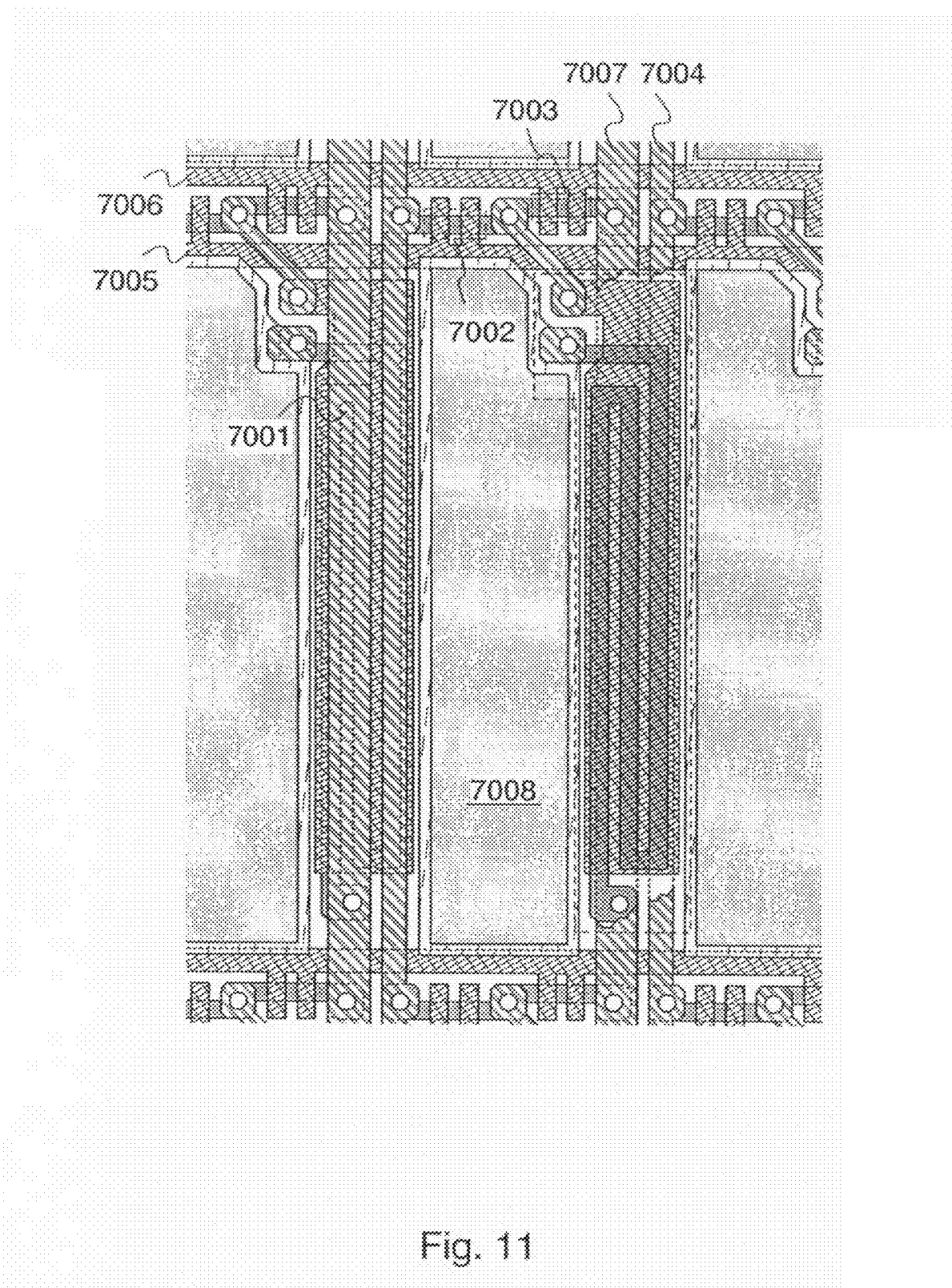
FIG. 11 is a top view of a pixel portion of a light-emitting device according to the present invention.

FIG. 11 shows a top view of a pixel portion of a light-emitting device that has a function of displaying. In the pixel portion, a light-emitting element, a driving transistor 7001 that determines a light-emitting or non light-emitting state of the light-emitting element in accordance with an image signal, a switching transistor 7002 that controls an input of the image signal, an erasing transistor 7003 that controls the light-emitting element to be a non light-emitting state regardless of the image signal, a source signal line 7004, a first scan line 7005, a second scan line 7006, and a current supply line 7007 are provided. The light-emitting element according to the present invention is formed in a region 7008. In addition, FIG. 13A shows a driver circuit diagram of a pixel portion of a light-emitting device that has the pixel structure shown in FIG. 11.

When the first scan line 7005 is selected in a writing period, the switching transistor 7002 that has a gate connected to the first scan line 7005 is turned on. Then, when a video signal input to the source signal line 7004 is input to a gate of the driving transistor 7001 through the switching transistor 7002, a current flows from the current supply line 7007 to the light-emitting element to emit light. In a retention period, the switching transistor 7002 is turned off by controlling the electric potential of the first scan line 7005 to retain the electric potential of the video signal written in the writing period. In an erasing period, since the second scan line 7006 is selected to turn on the erasing transistor 7003 to turn off the driving transistor 7001, a state in which no current is supplied to the light-emitting element can be produced compellingly.

Figure 12:
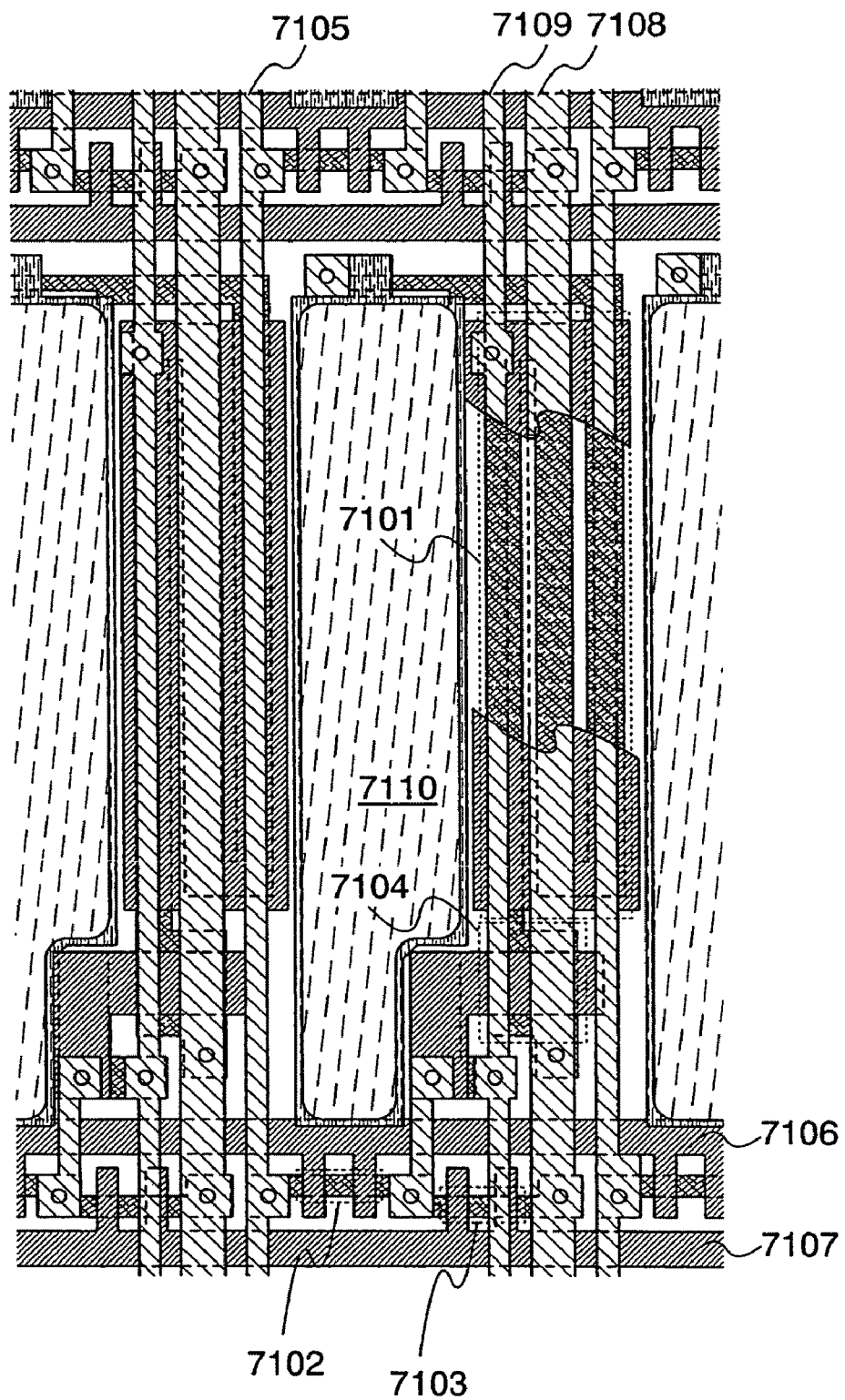
FIG. 12 is a top view of a pixel portion of a light-emitting device according to the present invention.
Figure 13A:
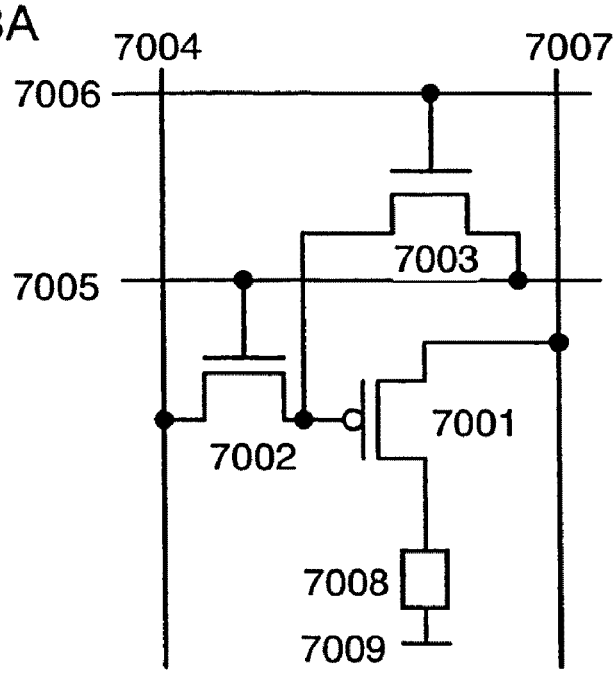
FIGS. 13A and 13B are circuit diagrams of pixel portions of light-emitting devices according to the present invention.
Figure 13B:
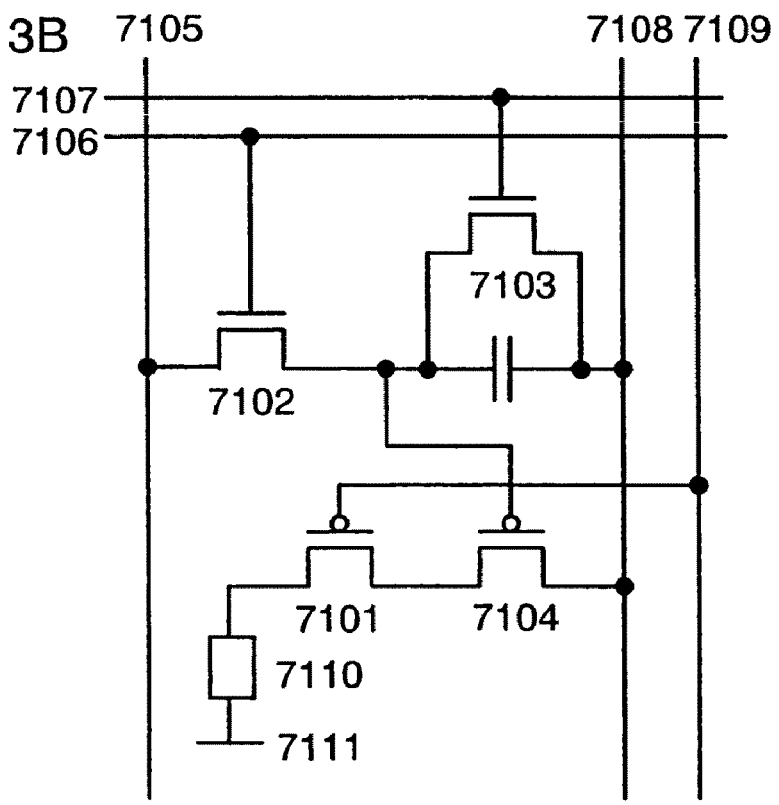

FIG. 12 shows a top view of a pixel portion of a light-emitting device that has a function of displaying, which has a different circuit structure from FIG. 11. In the pixel portion, a driving transistor 7101 that has a fixed gate potential, a switching transistor 7102 that controls an input of the image signal, an erasing transistor 7103 that controls the light-emitting element to be a non light-emitting state regardless of the image signal, a current controlling transistor 7104 that controls a current supply to the light-emitting element, a source signal line 7105, a first scan line 7106, a second scan line 7107, a current supply line 7108, and a power line 7109 are provided. The light-emitting element according to the present invention is formed in a region 7110. In addition, FIG. 13B shows a driver circuit diagram of a pixel portion of a light-emitting device that has the pixel structure shown in FIG. 12.

When the first scan line 7106 is selected in a writing period, the switching transistor 7102 that has a gate connected to the first scan line 7106 is turned on. Then, when a video signal input to the source signal line 7105 is input to a gate of the current controlling transistor 7104 through the switching transistor 7102, a current flows from the current supply line 7108 to the light-emitting element through the driving transistor 7101 to emit light. The driving transistor 7101 has a gate electrode connected to the power line 7109. In a retention period, the switching transistor 7102 is turned off by controlling the electric potential of the first scan line 7106 to retain the electric potential of the video signal written in the writing period. In an erasing period, since the second scan line 7107 is selected to turn on the erasing transistor 7103 to turned off the current controlling transistor 7104, a state in which no current is supplied to the light-emitting element can be produced compellingly.

In the above-mentioned light-emitting devices, the structure of each transistor is not particularly limited. A single-gate structure or a multi-gate structure may be used. In addition, an LDD structure may be used, or a gate-overlap LDD structure in which an LDD portion is overlapped with a gate electrode may be used.

In the light-emitting devices shown in the present embodiment, by applying the present invention, a defect due to a factor such as sputtering or short circuit between electrodes is suppressed so that favorable images can be displayed.

Embodiment 5

The light-emitting devices according to the present invention, which are shown in Embodiments 3 and 4, are mounted in various electronic devices after attaching an external input terminal and sealing.

In these electronic devices according to the present invention, a defect in displaying due to a defect of a light-emitting element (damage to a light-emitting element) is suppressed, and favorable images can be displayed.

In the present embodiment, a light-emitting device according to the present invention and an electronic device mounted with the light-emitting device will be described with reference to FIGS. 14, 15, and 16. However, the light-emitting device and electronic device shown in FIGS. 14, 15, and 16 are just one example, and the structure of the light-emitting device is not to be considered limited to the present embodiment.

Figure 14:
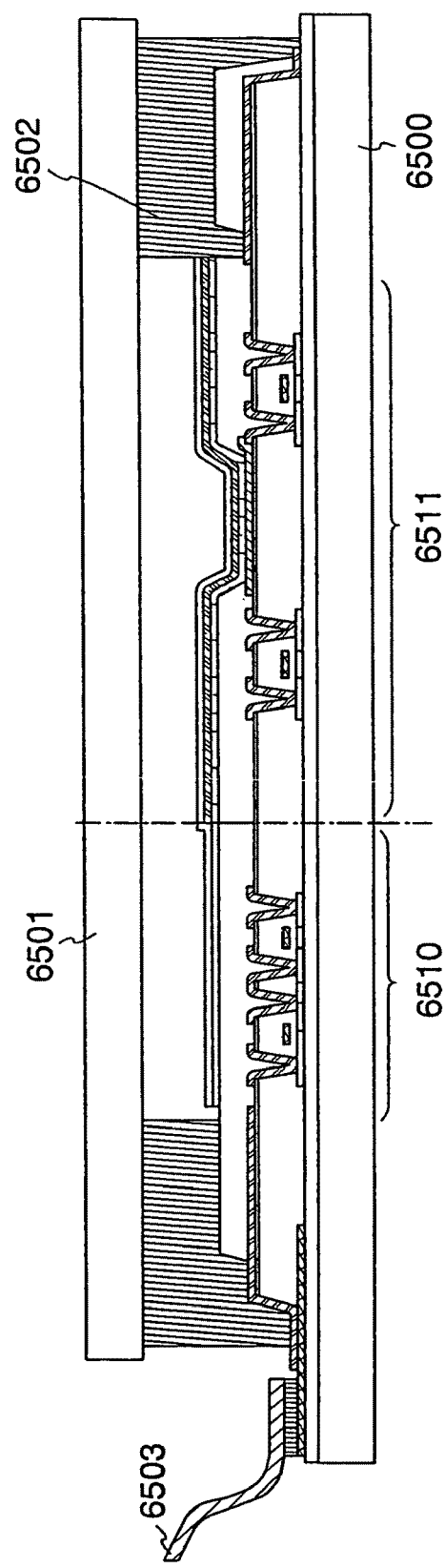
FIG. 14 is a diagram illustrating a cross-section structure of a light-emitting device according to the present invention.

FIG. 14 is a cross-section view of a light-emitting device after sealing. A substrate 6500 and a sealing substrate 6501 are bonded with a sealing agent 6502 to sandwich a transistor and a light-emitting element according to the present invention in between. An FPC (Flexible Printed Circuit) 6503 that serves as an external input terminal is attached to an edge of the substrate 6500. In addition, a region sandwiched between the substrate 6500 and the sealing substrate 6501 is filled with an inert gas such as nitrogen or a resin material.

Figure 15:
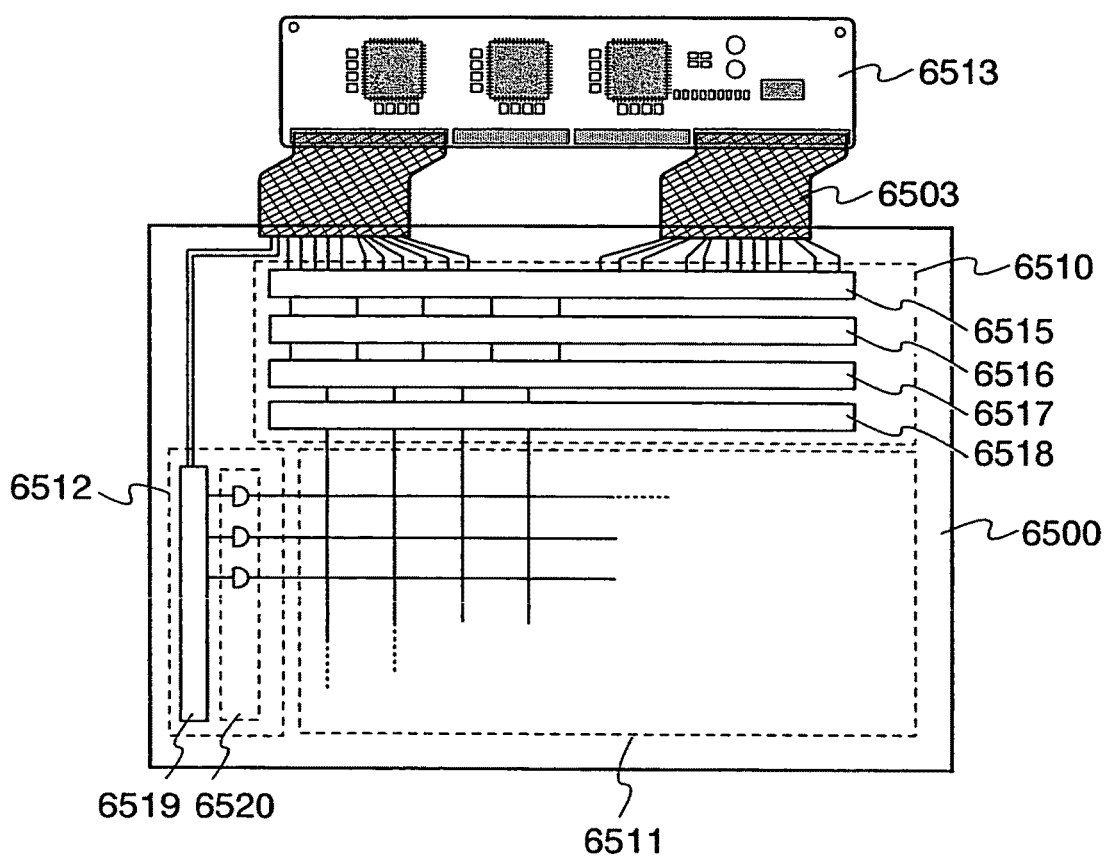
FIG. 15 is a view showing a frame format of a light-emitting device according to the present invention.

FIG. 15 is an overhead view of showing a frame format of the light-emitting device according to the present invention. In FIG. 15, portions 6510, 6511, and 6512 shown by dashed lines are a driver circuit portion (a source side driver circuit), a pixel portion, and a driver circuit portion (a gate side driver circuit). In the pixel portion 6511, the light-emitting element according to the present invention is provided. The driver circuit portions 6510 and 6512 are connected through the FPC 6503 that serves as an external input terminal and a group of wiring formed on the substrate 6500. By receiving signals such as a video signal, a clock signal, a start signal, and a reset signal from the FPC (Flexible Printed Circuit) 6503, the signals are input to the source side driver circuit 6510 or the gate side driver circuit 6512. Further, a printed wiring board (PWB) 6513 is attached to the FPC 6503. In the driver circuit portion 6510, a shift register 6515, a switch 6516, and memories (latches) 6517 and 6518 are provided. In the driver circuit portion 6512, a shift register 6519 and a buffer 6520 are provided. In addition to these, another function may be provided.

Figure 16:
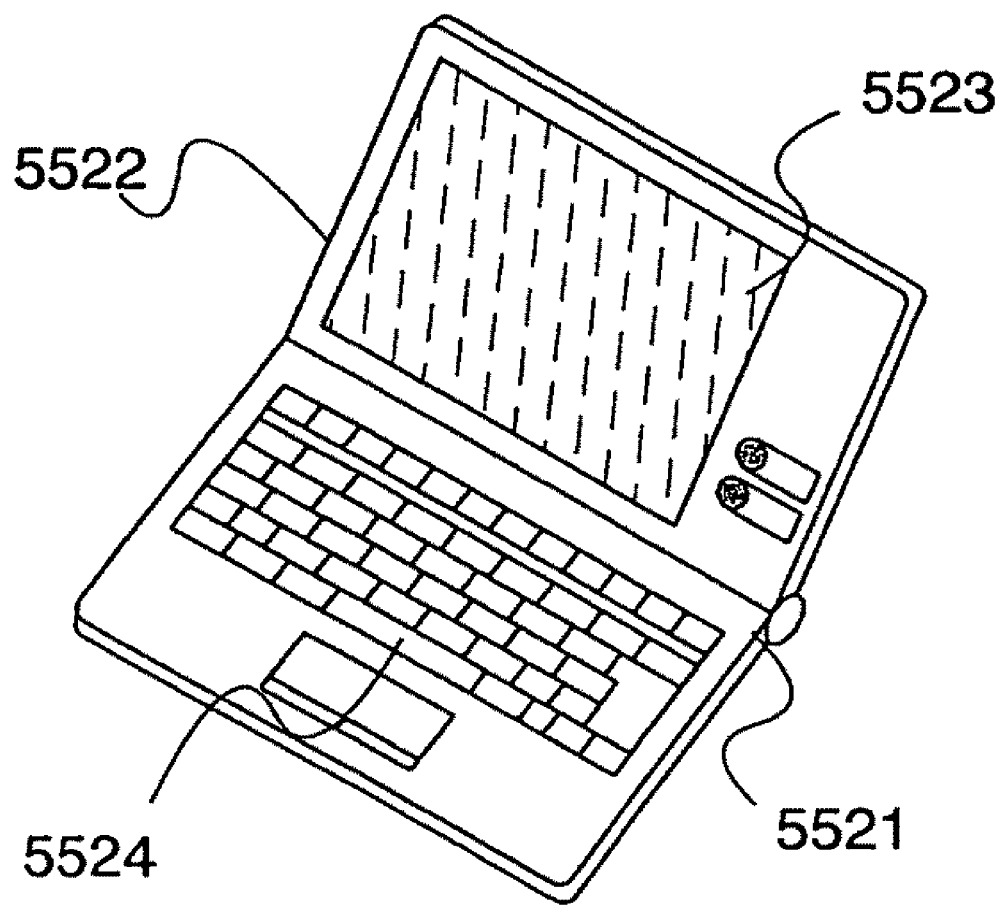
FIG. 16 is a diagram of an electronic device mounted with a light-emitting device according to the present invention.

FIG. 16 shows an example of an electronic device mounted with the light-emitting device according to the present invention.

FIG. 16 shows a laptop personal computer manufactured according to the present invention, which includes a main body 5521, a frame body 5522, a display portion 5523, and a keyboard 5524. A display device can be completed by incorporating a light-emitting device that has a light-emitting element according to the present invention into a personal computer.

In the present embodiment, the laptop personal computer is described. However, in addition, a light-emitting device that has a light-emitting element according to the present invention may be mounted in a device such as a cellular phone, a television, a car navigation system, or a lighting apparatus.

This application is based on Japanese Patent Application serial no. 2003-345579 filed in Japan Patent Office on 3, Oct. 2003, the contents of which are hereby incorporated by reference.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

What is claimed is:

1. A light-emitting element comprising:
   a first electrode;
   a second electrode;
   a first layer comprising a first organic material between the first electrode and the second electrode; and
   a second layer comprising a metal oxide and a second organic material between the second electrode and the first layer,
   wherein the second layer is in direct contact with the second electrode,
   wherein the first layer is in direct contact with the second layer, and
   wherein the first organic material is a hole transporting material.

2. The light-emitting element according to claim 1, wherein the second electrode is formed later than the first electrode.

3. The light-emitting element according to claim 1, wherein the second layer has a thickness of 10 nm to 200 nm.

4. The light-emitting element according to claim 1, wherein the second layer is formed by evaporation.

5. The light-emitting element according to claim 1, wherein the metal oxide is one of molybdenum oxide, vanadium oxide, ruthenium oxide, tungsten oxide, and manganese oxide.

6. The light-emitting element according to claim 1, wherein the second electrode is formed by sputtering.

7. The light-emitting element according to claim 1, wherein the light emitting element is incorporated into at least one selected from the group consisting of a laptop personal computer, a cellular phone, a television, a car navigation system, and a lighting apparatus.

8. A light-emitting element comprising:
   a first layer comprising a first organic material;
   a second layer comprising a metal oxide and a second organic material over the first layer; and
   a third layer formed by sputtering over the second layer,
   wherein the first layer is in direct contact with the second layer,
   wherein the second layer is in direct contact with the third layer, and
   wherein the first organic material is a hole transporting material.

9. The light-emitting element according to claim 8, wherein the second layer has a thickness of 10 nm to 200 nm.

10. The light-emitting element according to claim 8, wherein the second layer is formed by evaporation.

11. The light-emitting element according to claim 8, wherein the metal oxide is one of molybdenum oxide, vanadium oxide, ruthenium oxide, tungsten oxide, and manganese oxide.

12. The light-emitting element according to claim 8, wherein the light emitting element is incorporated into at least one selected from the group consisting of a laptop personal computer, a cellular phone, a television, a car navigation system, and a lighting apparatus.

13. A light-emitting device comprising the light-emitting element according to claim 1.

14. A light-emitting device comprising the light-emitting element according to claim 8.

15. The light-emitting element according to claim 1, wherein the second organic material is a hole transporting material.

16. The light-emitting element according to claim 8, wherein the second organic material is a hole transporting material.

17. The light-emitting element according to claim 1, wherein the second organic material is at least one of $\alpha$-NPD, TPD, TDATA and MTDATA.

18. The light-emitting element according to claim 8, wherein the second organic material is at least one of $\alpha$-NPD, TPD, TDATA and MTDATA.

19. The light-emitting element according to claim 1, wherein the hole transporting material is an aromatic amine compound.

20. The light-emitting element according to claim 8, wherein the hole transporting material is an aromatic amine compound.

21. A light-emitting element comprising:
    a first electrode;
    a second electrode; and
    a layer comprising a metal oxide and an organic material between the first electrode and the second electrode,
    wherein the layer is in direct contact with the second electrode.

22. The light-emitting element according to claim 21, wherein the layer has a thickness of 10 nm to 200 nm.

23. The light-emitting element according to claim 21, wherein the metal oxide is one of molybdenum oxide, vanadium oxide, ruthenium oxide, tungsten oxide, and manganese oxide.

24. The light-emitting element according to claim 21, wherein the light emitting element is incorporated into at least one selected from the group consisting of a laptop personal computer, a cellular phone, a television, a car navigation system, and a lighting apparatus.

25. A light-emitting device comprising the light-emitting element according to claim 21.

* * * * *